United States Patent
Kwon et al.

(12) 
(10) Patent No.: US 6,258,674 B1
(45) Date of Patent: Jul. 10, 2001

(54) HIGH VOLTAGE FIELD EFFECT TRANSISTOR AND METHOD OF FABRICATING THE SAME

(75) Inventors: Oh Kyong Kwon; Mueng Ryul Lee, both of Seoul (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/231,369

(22) Filed: Jan. 13, 1999

Related U.S. Application Data

(62) Division of application No. 09/139,110, filed on Aug. 25, 1998, now Pat. No. 5,907,173.

(30) Foreign Application Priority Data

Aug. 25, 1997 (KR) .................................................. 97-40699

(51) Int. Cl.$^7$ .................................................. H01L 21/336
(52) U.S. Cl. .................................................. 438/286; 438/306
(58) Field of Search .................................. 438/286, 306; 257/336, 409

(56) References Cited

U.S. PATENT DOCUMENTS

| | | | |
|---|---|---|---|
| 4,172,260 | 10/1979 | Okabe et al. | 257/409 |
| 4,270,137 | 5/1981 | Coe | 257/408 |
| 4,290,077 | 9/1981 | Ronen | 257/409 |
| 4,823,173 | 4/1989 | Beasom | 257/262 |
| 5,386,136 | 1/1995 | Williams et al. | 257/409 |
| 5,517,046 | * 5/1996 | Hsing et al. | 257/336 |
| 5,831,320 | * 11/1998 | Kwon et al. | 257/409 |
| 6,117,738 | * 9/2000 | Tung | 438/286 |

FOREIGN PATENT DOCUMENTS

| | | | |
|---|---|---|---|
| 404107869 | 4/1992 | (JP) | 257/409 |
| 404107875 | 4/1992 | (JP) | 257/409 |
| 404107876 | 4/1992 | (JP) | 257/409 |
| 404212465 | 8/1992 | (JP) | 257/409 |

\* cited by examiner

*Primary Examiner*—Long Pham
*Assistant Examiner*—William David Coleman
(74) *Attorney, Agent, or Firm*—Morgan, Lewis & Bockius LLP

(57) ABSTRACT

The present invention discloses a high voltage field effect transistor and fabricating the same. A high voltage field effect transistor includes a semiconductor substrate, a first conductivity type well in the semiconductor substrate, first and second conductivity type drift regions in the first conductivity type well, heavily doped impurity regions having first and second conductivity types in the first conductivity type drift region, a heavily doped second conductivity type impurity region in the second conductivity type drift region, and a lightly doped second conductivity type buffer layer in the second conductivity type drift region to surround the heavily doped second conductivity type impurity region.

10 Claims, 13 Drawing Sheets

HIGH VOLTAGE FIELD EFFECT TRANSISTOR AND METHOD OF FABRICATING THE SAME

This application is a Division of Ser. No. 09/139,110 filed Aug. 25, 1998, now U.S. Pat. No. 5,907,173.

BACKGROUND OF THE INVENTION

1. Field of the Invention

The present invention relates to a semiconductor device and, more particularly, to a high voltage field effect transistor and a method of fabricating the same. Although the present invention is suitable for a wide scope of applications, it is particularly suitable for increasing a secondary breakdown voltage.

2. Discussion of the Related Art

Power MOSFETs have a high switching speed comparing to the other power devices. Specifically, high voltage lateral power MOSFETs have been preferred as large-integrated power devices in recent years since an ON resistance is low in a device of less than 300 V having a relatively low internal pressure.

For example, the high voltage power device includes DMOSFET (Double-diffused MOSFET), IGBT (Insulated Gate Bipolar Transistor), EDMOSFET (Extended Drain MOSFET), and LDMOSFET (Lateral Double-Diffused MOSFET).

Among these devices, LDMOSFETs are widely used for HSD (High Side Driver) and LSD (Low Side Driver), or H-bridge circuits. Although the LDMOSFETs are easy to fabricate, a threshold voltage becomes high because a dopant concentration of the channel region, which determines the structure of the LDMOSFET, is not uniform. Thus, a breakdown at the surface of the silicon substrate occurs in a drift region neighboring the channel. Accordingly, the EDMOSFET has been recently developed to overcome the above-mentioned disadvantages.

An EDMOSFET according to a background art will be described wit h reference to the attached drawings.

FIGS. 1 and 2 are cross-sectional views illustrating an n-channel EDMOSFET and a p-channel EDMOSFET according to the background art.

Initially referring to FIG. 1, a structure of the n-channel EDMOSFET according to the background art includes a p-type drift region 2 and an n-type drift region 3 respectively formed in a p-type well 1. The n-type drift region 3 has a lightly doped drain (LDD) region in the vicinity of a gate to form a channel. On the p-type well 1 having the p-type drift region 2 and the n-type drift region 3, a gate electrode 4 is formed to have a gate insulating layer 32 interposed therebetween. One side edge of the gate electrode 4 is positioned at the boundary between the p-type drift region 2 and the n-type drift region 3.

In the p-type drift region 2, a heavily doped n-type source region 3 is formed around one side of the gate electrode 4, while a heavily doped p-type impurity region 6 for an electrical contact is at one side of the source region 5. A heavily doped n-type drain region 7 is spaced apart at a predetermined distance from the gate electrode 4 in the n-type drift region 3.

A source electrode 8 is disposed on the heavily doped n-type source region 5 including the heavily doped p-type impurity region 6. A drain electrode 9 is formed on the heavily doped n-type drain region 7, while a field plate 10 is formed over the one side edge of the gate electrode 4 and the n-type drift region 3.

On the other hand, a p-channel EDMOSFET according to the background art has a similar structure to the n-channel EDMOSFET except for conductivity types. As shown in FIG. 2, an n-type drift region 12 and a p-type drift region 13 are formed in an n-type well 11. The p-type drift region 13 has an LDD in the vicinity of a gate to form a channel. On the n-type well 11 having the n-type drift region 12 and the p-type drift region 13, a gate electrode 14 is formed to have a gate insulating layer 32 interposed therebetween. One side edge of the gate electrode 14 is positioned at the boundary between the n-type drift region 12 and the p-type drift region 13.

In the n-type drift region 12, a heavily doped p-type source region 15 is formed around one side of the gate electrode 14 and a heavily doped n-type impurity region 16 for a body contact is around one side of the source region 15. A heavily doped p-type drain region 17 is spaced apart at a predetermined distance from the gate electrode 14 in the p-type drift region 13.

A source electrode 18 is disposed on the heavily doped p-type source region 15 including the heavily doped n-type impurity region 16. A drain electrode 19 is formed on the heavily doped p-type drain region 17, while a field plate 20 is over the one side edge of the gate electrode 14 and the p-type drift region 13.

The operation of such a EDMOSFET according to the background art will be described as follows.

Since the operation of the n-channel EDMOSFET is the same as that of the p-type channel EDMOSFET, only the former will be described for example.

Upon applying a voltage higher than a threshold voltage to the gate electrode 4 and a voltage higher than the voltage of the source electrode 8 to the drain electrode 9, the voltage flows to the drain region 7 through the n-type drift region 3 through the channel region below the gate electrode 4 from the source region 5. At this stage, the breakdown voltage is increased because the field plate 10 prevents a breakdown at the end portion of the gate neighboring the drain region 8. Furthermore, when an appropriate voltage is applied to the field plate 10, a current path of the drift regions will be adjusted, thereby reducing a conduction resistance.

The MOSFET can be operated by two different methods. One method is to apply a gate voltage to the field plate 10 to raise the breakdown voltage and simultaneously to employ characteristics of the conduction resistance. The other is to reduce the conduction resistance by applying a constant voltage to the field plate spaced apart from the gate electrode.

However, the aforementioned EDMOSFET and LDMOSFET according to the background art have the following problems.

Although the EDMOSFET and LDMOSFET according to the background art is designed to have a primary breakdown voltage 'high' without applying a voltage to the gate electrode, a secondary breakdown voltage is decreased when a voltage is applied to the gate electrode. Accordingly, the EDMOSFET or LDMOSFET according to the background art, which is designed to have the primary breakdown voltage as high as about 170 V, has the secondary breakdown voltage not higher than about 60 V when 20 V is applied to the gate electrode.

SUMMARY OF THE INVENTION

Accordingly, the present invention is directed to a high-voltage field effect transistor and method of fabricating the same that substantially obviates one or more of problems due to limitations and disadvantages of the related art.

An objective of the present invention is to provide a high voltage field effect transistor with enhanced SOA (Safe Operation Area) characteristic by improving a secondary breakdown voltage, and its fabricating method.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a high voltage field effect transistor includes a first conductivity type drift region and a second conductivity type drift region formed within a first conductivity type well, a gate electrode formed on the first conductivity type well, a heavily doped second conductivity type source region and a heavily doped first conductivity type impurity region formed in the first conductivity type drift region on the one side of the gate electrode, a heavily doped second conductivity type drain region formed in the second conductivity type drift region and spaced at a predetermined distance from the gate electrode, a lightly doped second conductivity type buffer layer formed in the second conductivity type drift region to surround the heavily doped second conductivity type drain region, a source electrode formed across the source region and the heavily doped first conductivity type impurity region, a drain electrode formed in the drain region, and a field plate formed over the one side edge of the gate electrode and the second conductivity type drift region.

In another aspect of the present invention, a method of fabricating a high voltage field effect transistor includes the steps of forming a first conductivity type well on a semiconductor substrate, forming a first conductivity type drift region and a second conductivity type drift region within the first conductivity type well, independently, forming a gate insulating layer on the whole surface of the semiconductor substrate, and then, a gate electrode on the gate insulating layer, forming a lightly doped second conductivity type buffer layer in the second conductivity type drift region spaced at a predetermined distance from the gate electrode, forming heavily doped second conductivity type source and drain regions in the first conductivity type drift region on the one side of the gate electrode and in the buffer layer, respectively, and forming a heavily doped first conductivity type impurity region in the first conductivity drift region on the one side of the source region.

In another aspect of the present invention, a high voltage field effect transistor includes a semiconductor substrate, a first conductivity type well in the semiconductor substrate, first and second conductivity type drift regions in the first conductivity type well, heavily doped impurity regions having first and second conductivity types in the first conductivity type drift region, a heavily doped second conductivity type impurity region in the second conductivity type drift region, and a lightly doped second conductivity type buffer layer in the second conductivity type drift region to surround the heavily doped second conductivity type impurity region.

In a further aspect of the present invention, a method of fabricating a high voltage field effect transistor having a semiconductor substrate includes the steps of forming a first conductivity type well in the semiconductor substrate, forming first and second conductivity type drift regions in the first conductivity type well, forming a gate electrode over the first conductivity type drift region, forming a lightly doped second conductivity type buffer layer in the second conductivity type drift region and a lightly doped second conductivity type layer at a boundary between the first and second conductivity type drift regions, forms heavily doped first conductivity type impurity regions in the first conductivity type drift region and a heavily doped second conductivity type impurity region in the buffer layer, and forming a heavily doped first conductivity type impurity region in the first conductivity drift region.

It is to be understood that both the foregoing general description and the following detailed description are exemplary of the invention as claimed.

DETAILED DESCRIPTION OF THE PREFERRED EMBODIMENTS

Reference will now be made in detail to the preferred embodiments of the present invention, examples of which are illustrated in the accompanying drawings.

Figure 1:
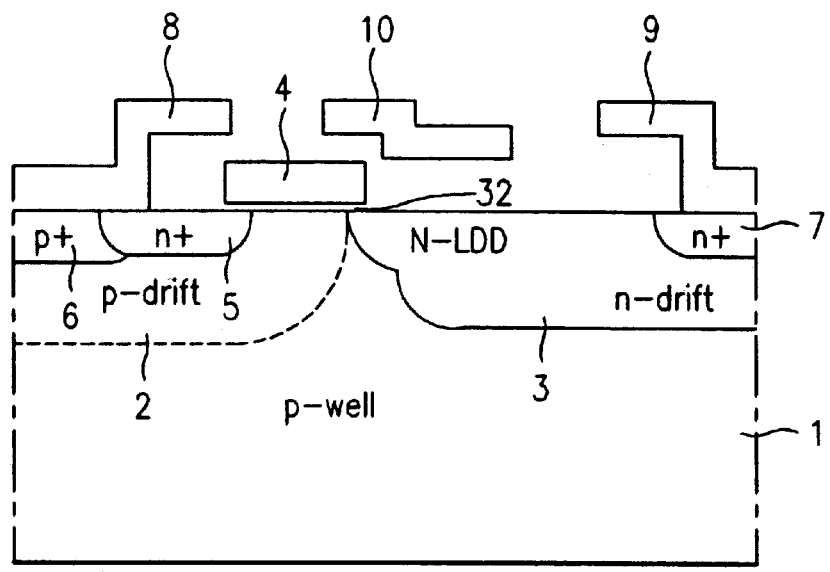
FIG. 1 is a cross-sectional view of an n-channel high voltage field effect transistor.
Figure 2:
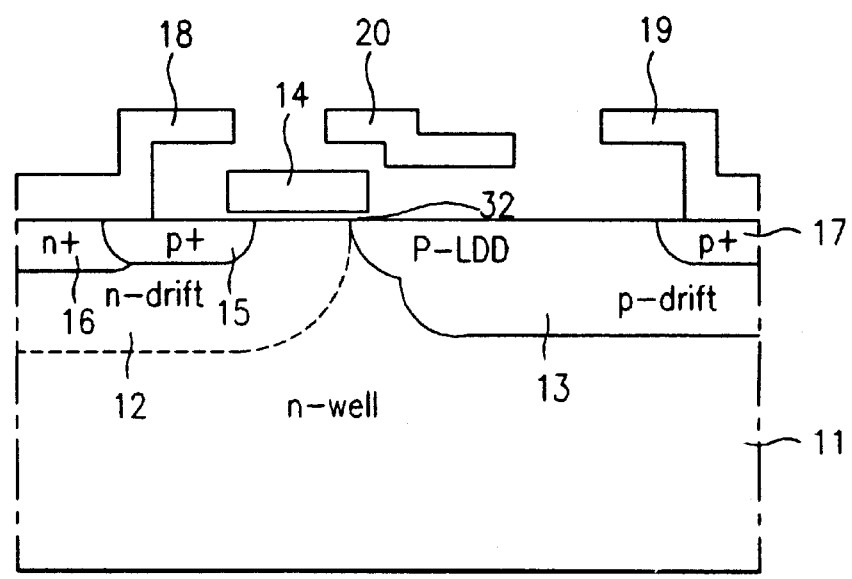
FIG. 2 is a cross-sectional view of a p-channel high voltage field effect transistor.
Figure 3:
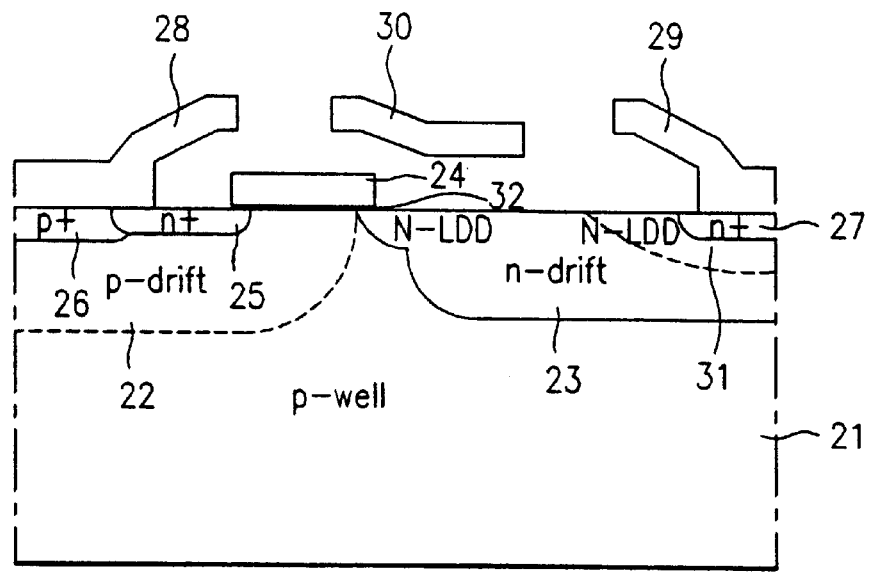
FIG. 3 is a cross-sectional view of an n-channel high voltage field effect transistor in accordance with a first embodiment of the present invention.
Figure 4:
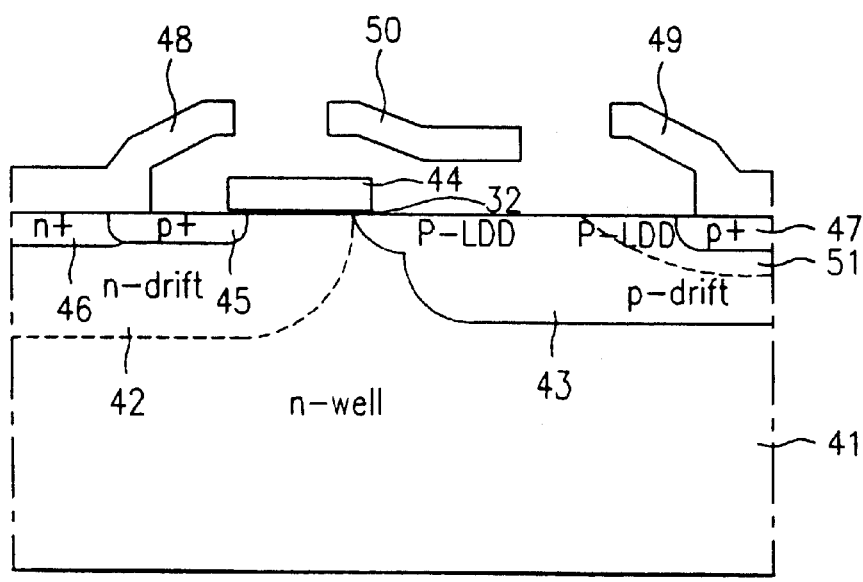
FIG. 4 is a cross-sectional view of a p-channel high voltage field effect transistor in accordance with a second embodiment of the present invention.

FIG. 3 is a cross-sectional view showing a structure of an n-channel EDMOSFET in accordance with a first preferred embodiment of the present invention, and FIG. 4 is a cross-sectional view of a p-channel EDMOSFET in accordance with a second preferred embodiment of the present invention.

Initially referring to FIG. 3, a high-voltage field effect transistor according to the first preferred embodiment of the present invention has a p-type drift region 22 and an n-type drift region 23 within a p-type well 21. The n-type drift region 23 is formed to have a lightly doped drain (LDD) structure at a channel region in order to form a self-aligned channel. A gate electrode 24 is disposed on the p-type well 21 having the p-type drift region 22 and the n-type drift region 23. A gate insulating layer 32 is formed between the gate electrode 24 and the p-type well 21. One of the side edges of the gate electrode 24 is positioned over the boundary between the p-type drift region 22 and the n-type drift region 23.

The p-type drift region 22 includes a heavily doped n-type source region 25 formed below one side of the gate electrode 24 and a heavily doped p-type impurity region 26 for a body contact at around one side of the source region 25. In the n-type drift region 23, a heavily doped n-type drain region 27 is spaced apart from the gate electrode 24 at a predetermined distance and a lightly doped n-type buffer layer 31 is formed to surround the highly doped n-type drain region 27.

A source electrode 28 is disposed on the heavily doped n-type source region 25 including the heavily doped p-type impurity region 26. Further, a drain electrode 29 is formed on the heavily doped n-type drain region 27, while a field plate 30 is over the one of the side edges of the gate electrode 24 including the n-type drift region 23.

On the other hand, as illustrated in FIG. 4, the high voltage field effect transistor of the second preferred embodiment of the present invention has an n-type drift region 42 and a p-type drift region 43 within an n-type well 41. The p-type drift region 43 is formed to have an LDD structure at around a channel region in order to form a self-aligned channel. A gate electrode 44 is disposed on the n-type well 41 having the n-type drift region 42 and the p-type drift region 43. A gate insulating layer 32 is formed between the gate electrode 44 and the n-type well 41. One of the side edges of the gate electrode 44 is positioned at the boundary between the n-type drift region 42 and the p-type drift region 43.

The n-type drift region 42 includes a heavily doped p-type source region 45 formed at one side of the gate electrode 44 and a heavily doped n-type impurity region 46 for an electrical contact at one side of the source region 45. In the p-type drift region 43, a heavily doped p-type drain region 47 is spaced apart from the gate electrode 44 at a predetermined distance, and 47.

A source electrode 48 is disposed on the heavily doped p-type source region 45 including the heavily doped n-type impurity region 46. A drain electrode 49 is formed on the heavily doped p-type drain region 47, while a field plate 50 is formed over-one of the side edges of the gate electrode 44 including the p-type drift region 43.

A method of fabricating such a high voltage transistor of the present invention will be described with reference to the accompanying drawings.

FIGS. 5A to 5G are cross-sectional views illustrating the process steps of fabricating the n-channel high voltage field effect transistor in accordance with the first preferred embodiment of the present invention.

Figure 5A:
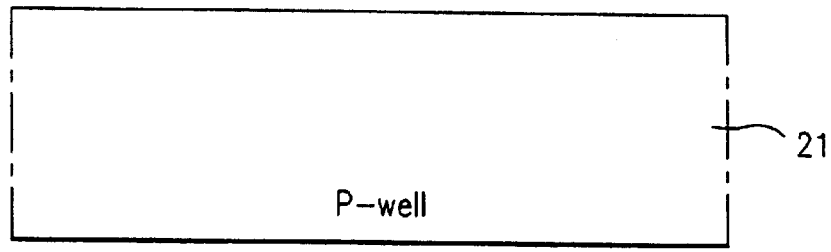
FIGS. 5A to 5G are cross-sectional views illustrating the process steps of fabricating the high voltage field effect transistor in accordance with the present invention.

As shown in FIG. 5A, p-type impurities are implanted and diffused into a semiconductor substrate to form the p-type well 21. In this process, the substrate is doped with boron (B) as impurity ions of the concentration of $5.3\times10^{12}$ atoms/cm$^2$ at an energy of 50 KeV. The diffusion is carried out at 1200° C. for about 380 minutes. The substrate having an SOI structure may be used in this structure.

Figure 5B:
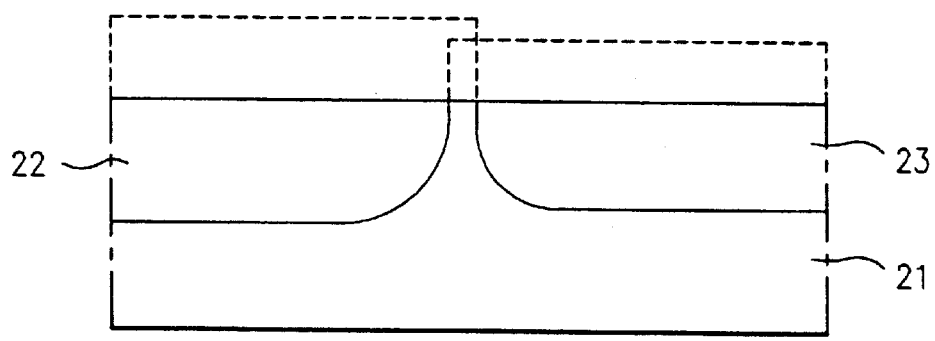

Referring to FIG. 5B, a p-type drift region 22 and an n-type drift region 23 are separately formed in the p-type well. In this step, after a mask is formed on the p-type well 21 except a portion to be the p-type drift region, boron ions having a concentration of $2\times10^{13}$ atoms/cm$^2$ at an energy of 50 KeV. Thereafter, a mask is formed on the p-type well 21 except a portion to be the n-type drift region. The portion is doped with phosphor ions having a concentration of $6.8\times10^{12}$ atoms/cm$^2$ at an energy of 150 KeV. Then, a diffusion process is carried out at about 1200° C. for 200 minutes.

Figure 5C:
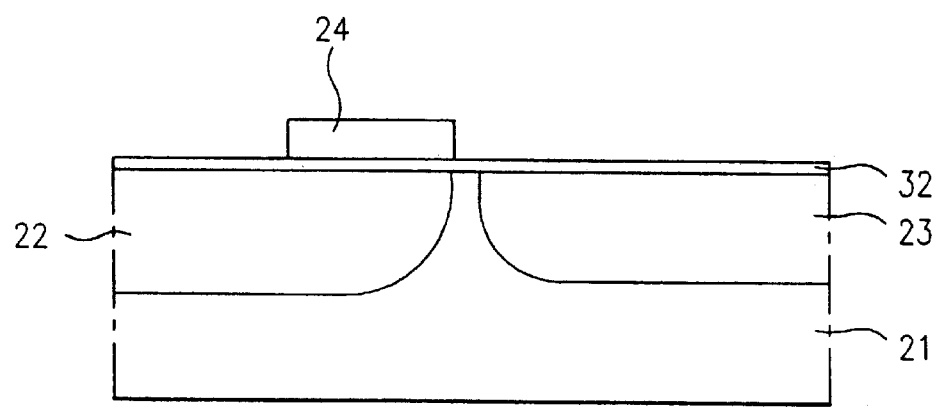

As shown in FIG. 5C, the gate insulating layer 32 and the gate electrode 24 are sequentially formed on the semiconductor substrate. After the gate insulating layer 32 and a polysilicon layer (not shown) are deposited on the semiconductor substrate, the polysilicon layer is selectively removed using a gate mask to form the gate electrode 24. The gate electrode 24 is disposed on the p-type drift region 22 and positioned at around the boundary between the p-type drift region 22 and the n-type drift region 23.

Figure 5D:
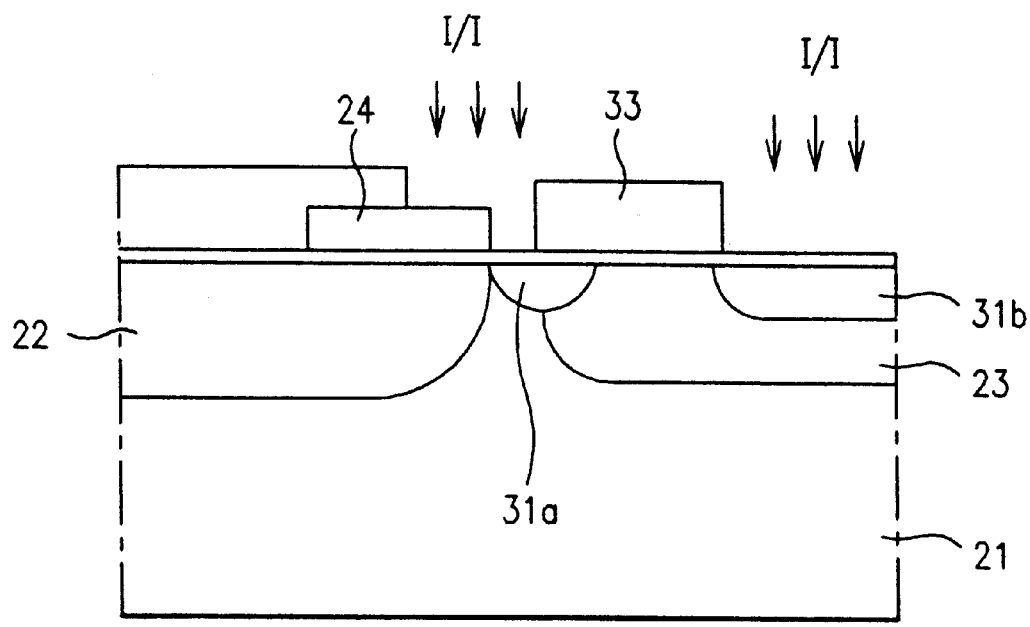

As shown in FIG. 5D, lightly doped n-type impurity regions 31a and 31b are formed at the boundary between the p-type drift region 22 and the n-type drift region 23. The n-type drift region 23 spaced apart from the gate electrode 24 at a predetermined distance.

In order to form the lightly doped n-type impurity regions 31a and 31b, a photoresist 33 is deposited over the semiconductor substrate and patterned to expose a portion of the n-type drift region 23 at one side of the gate electrode 24 and a portion of the n-type drift region 23 apart from the gate electrode 24. The portions are then lightly doped with impurity ions and subjected to a diffusion process. In this step, the impurity ions are phosphor ions injected with the concentration of $1\times10^{12}$ atoms/cm$^2$ at an energy of 80 KeV. The lightly doped n-type impurity region 31a is formed at the boundary of the p-type drift region 22 and the n-type drift region 23. The impurity region 31a is an LDD region self-aligned with the gate electrode 24, while the lightly doped n-type impurity region 31b becomes the buffer layer.

Figure 5E:
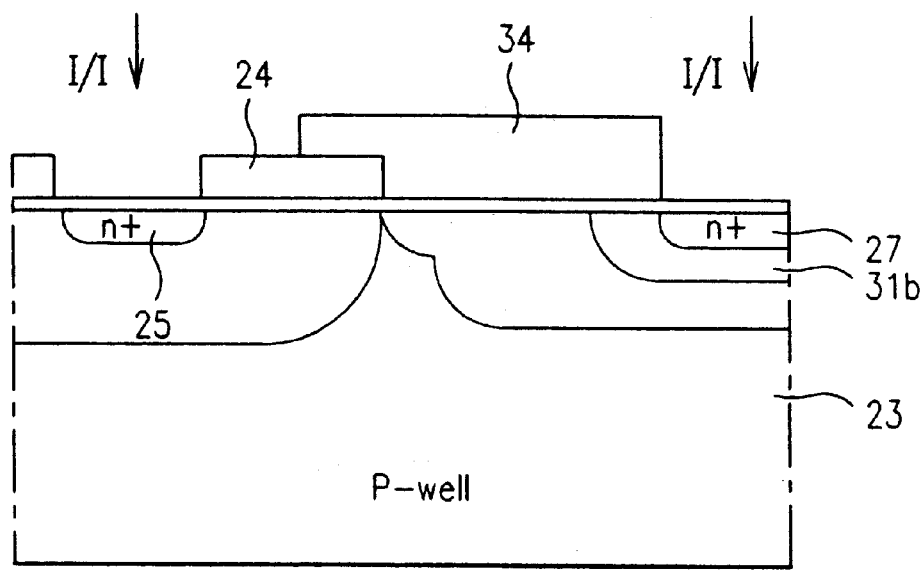

As shown in FIG. 5E, n-type impurities are heavily injected into the p-type drift region 22 at the other side of the gate electrode 24 through the lightly doped n-type impurity region 31b to form the source region 25 and the drain region 27. In this process, after removing the photoresist 33, a photoresist 34 is formed over the semiconductor substrate and subjected to an exposure and development process, thereby exposing the p-type drift region 22 at the other side of the gate electrode 24 and the lightly doped n-type impurity region 31b. Thus, the exposed regions 22 and 31b are heavily doped with n-type impurities to form the source region 25 and the drain region 27.

Figure 5F:
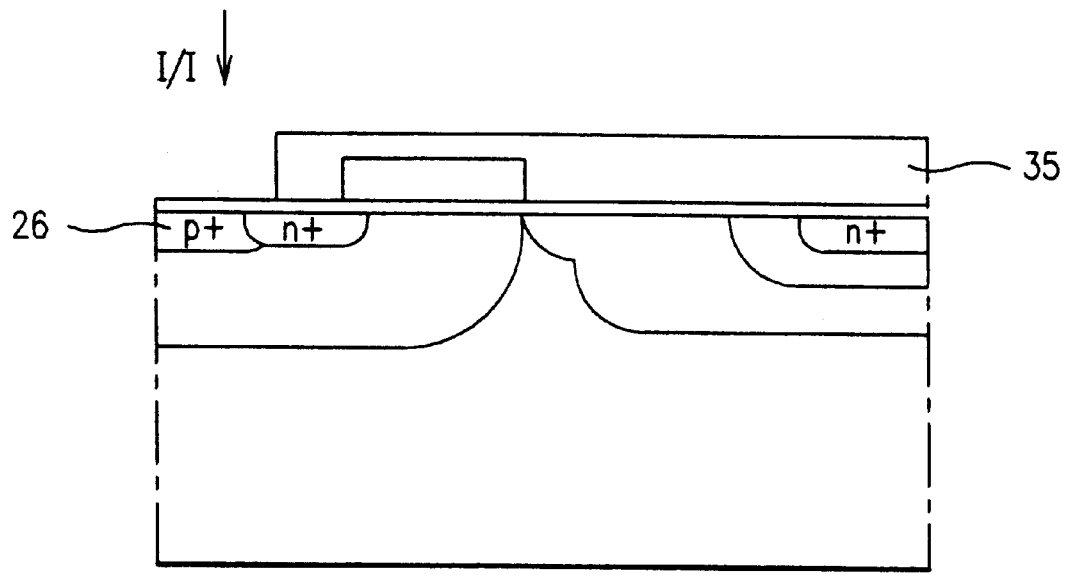

As shown in FIG. 5F, after removing the photoresist 34, a photoresist 35 is formed over the semiconductor substrate surface and patterned to expose one side of the source region for ion implantation. Thus, the heavily doped p-type impurity region 26 in the p-type drift region 22 is formed at the one side of the source region 25.

Figure 5G:
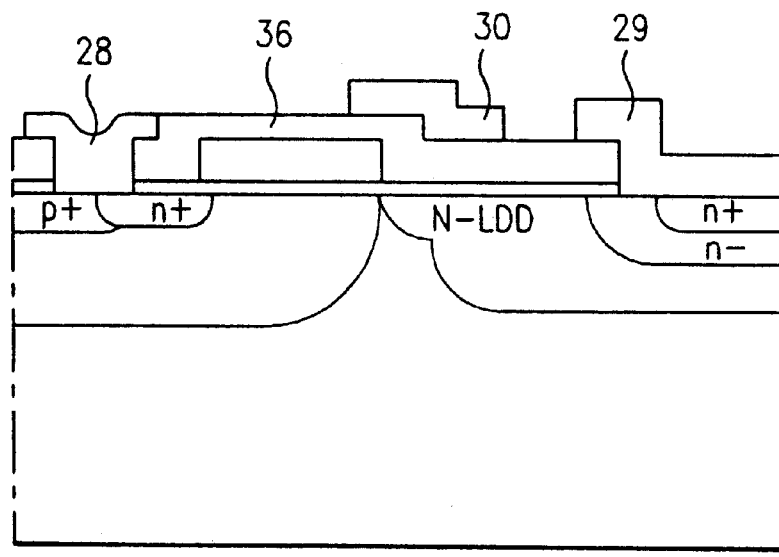

As shown in FIG. 5G, the insulating layer 36 is deposited at the surface of the substrate including the gate electrode 24. Thereafter, contact holes are formed in the source and drain regions 25 and 27. Then, a metal layer is deposited on the insulating layer 36 and patterned to form a source electrode 28, a field plate 30, and a drain electrode 29.

The p-type high-voltage transistor of the present invention can be fabricated by the same method as the n-type high-voltage transistor as illustrated in FIGS. 5A to 5G except for the conductivity types of the impurities.

In the present invention described above, the high-voltage field effect transistor provides advantages as follows.

FIGS. 6A to 6B and 7A to 7B are illustrated in order to fully explain the advantages of the present invention. FIGS. 6A to 6B and 7A to 7B are graphs plotting simulated breakdown voltage of p-type and n-type EDMOSFETs according to the background art, respectively, while FIGS. 8A to 8B and 9A to 9B are graphs plotting simulated breakdown voltage of p-type and n-type EDMOSFETs according to the present invention, respectively.

Figure 6A:
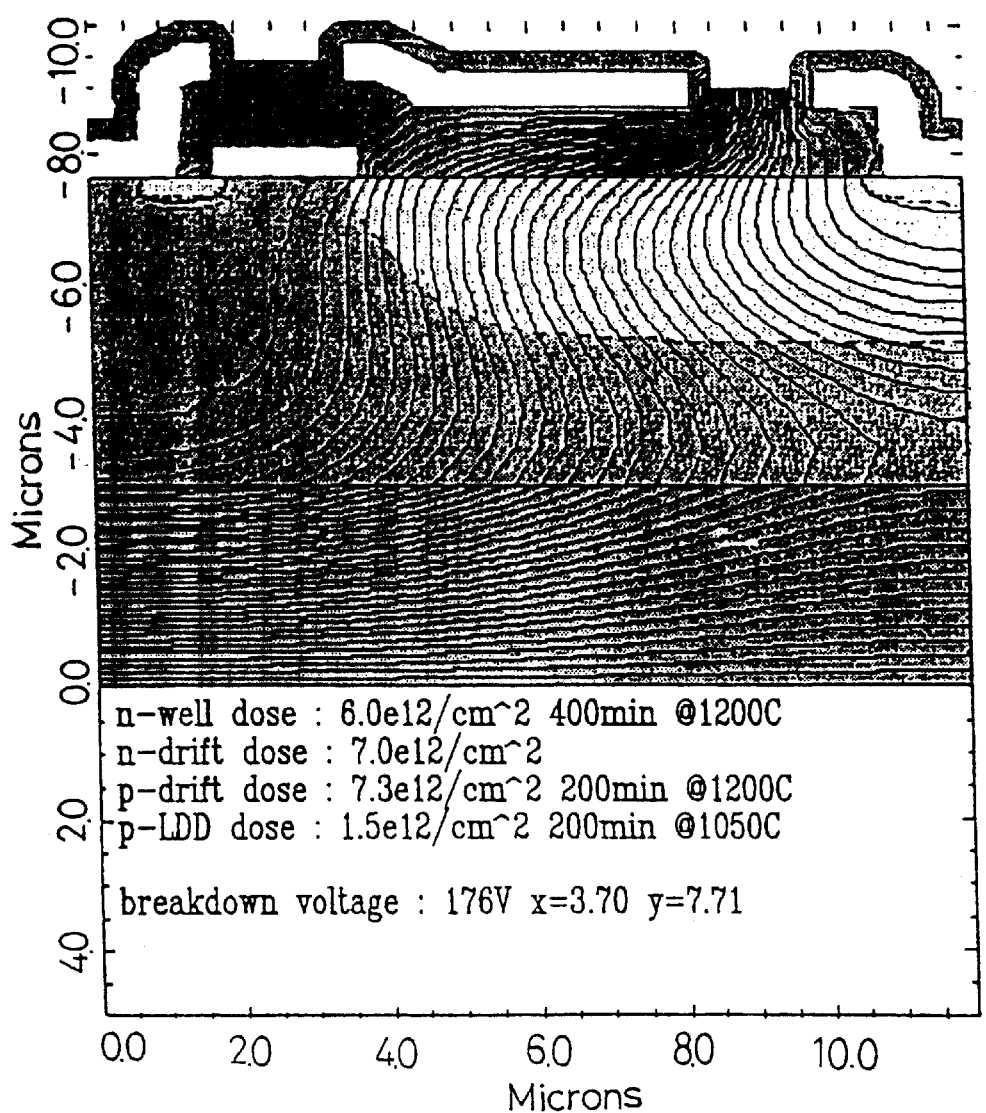
FIGS. 6A to 6B are graphs plotting simulated breakdown voltages of a p-type EDMOSFET according to the background art.
Figure 6B:
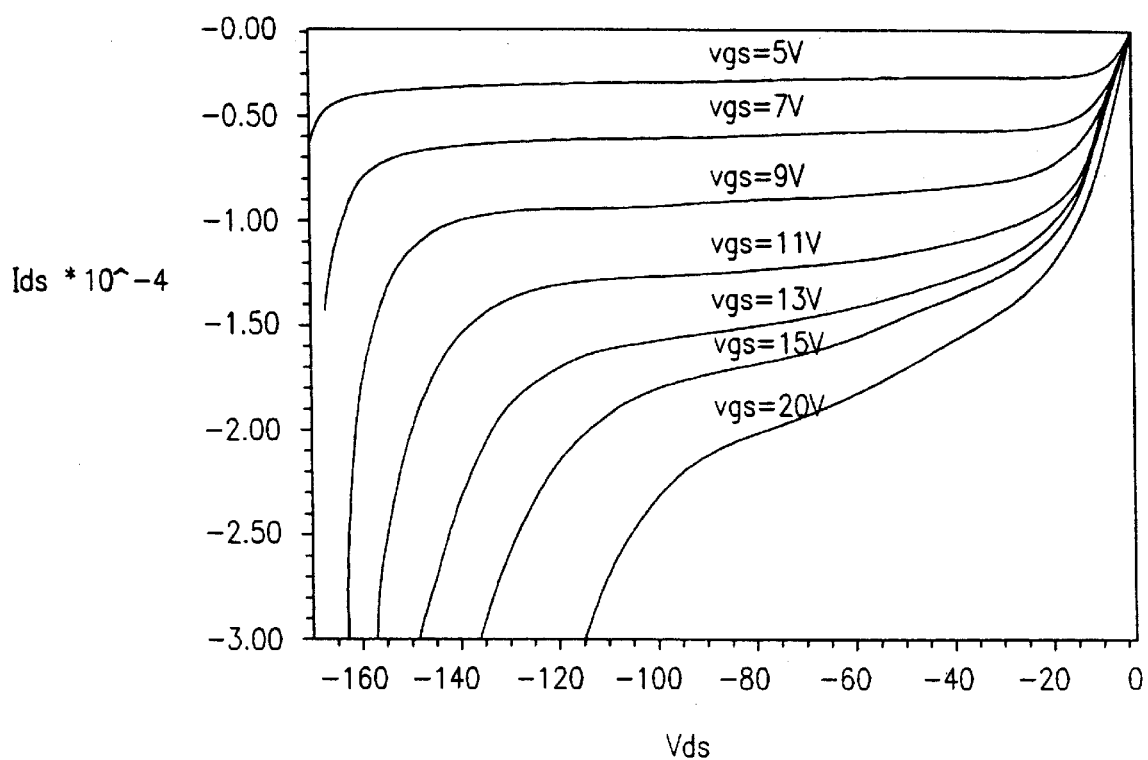
Figure 7A:
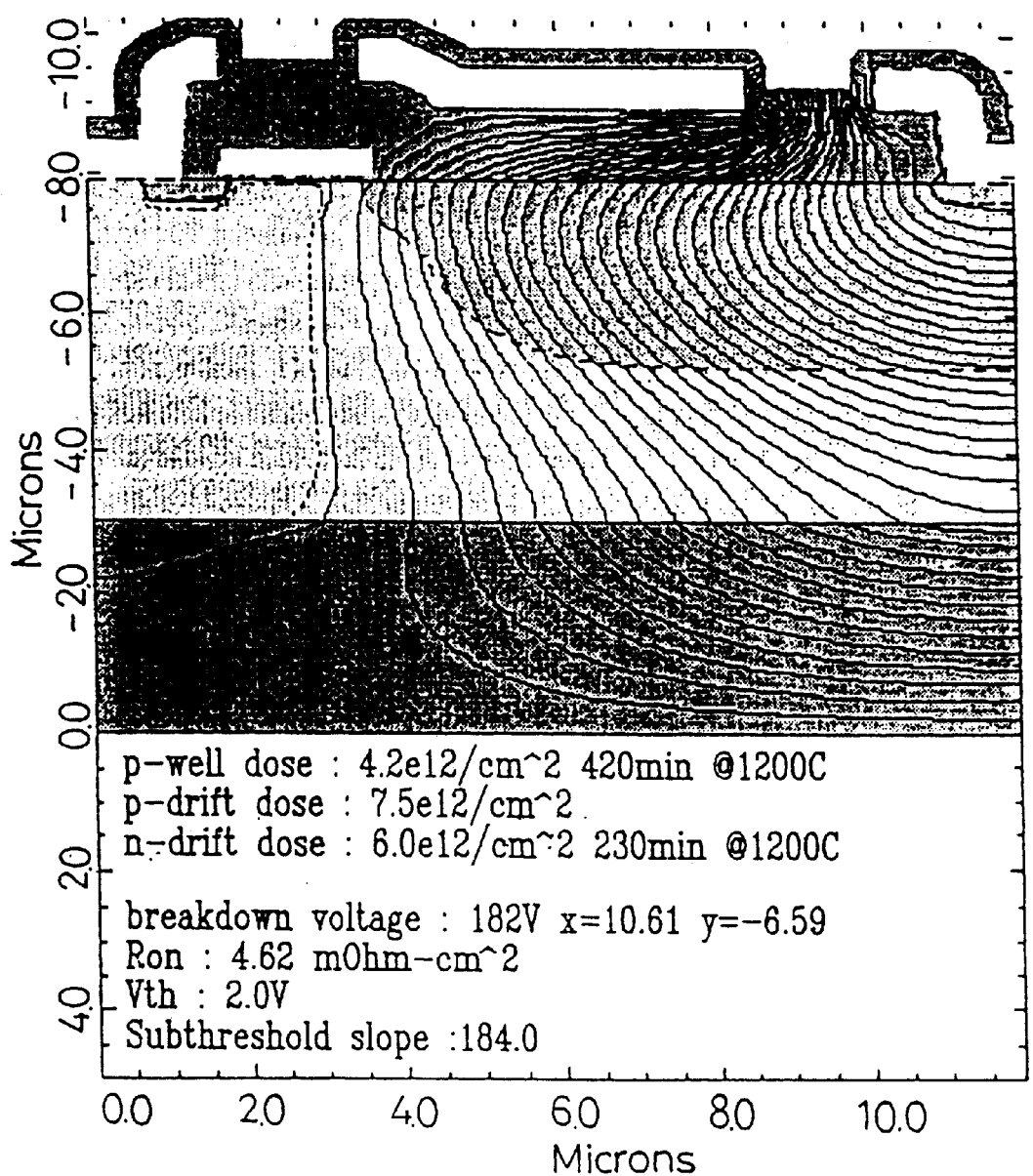
FIGS. 7A to 7B are graphs plotting simulated breakdown voltages of a conventional n-type EDMOSFET.
Figure 7B:
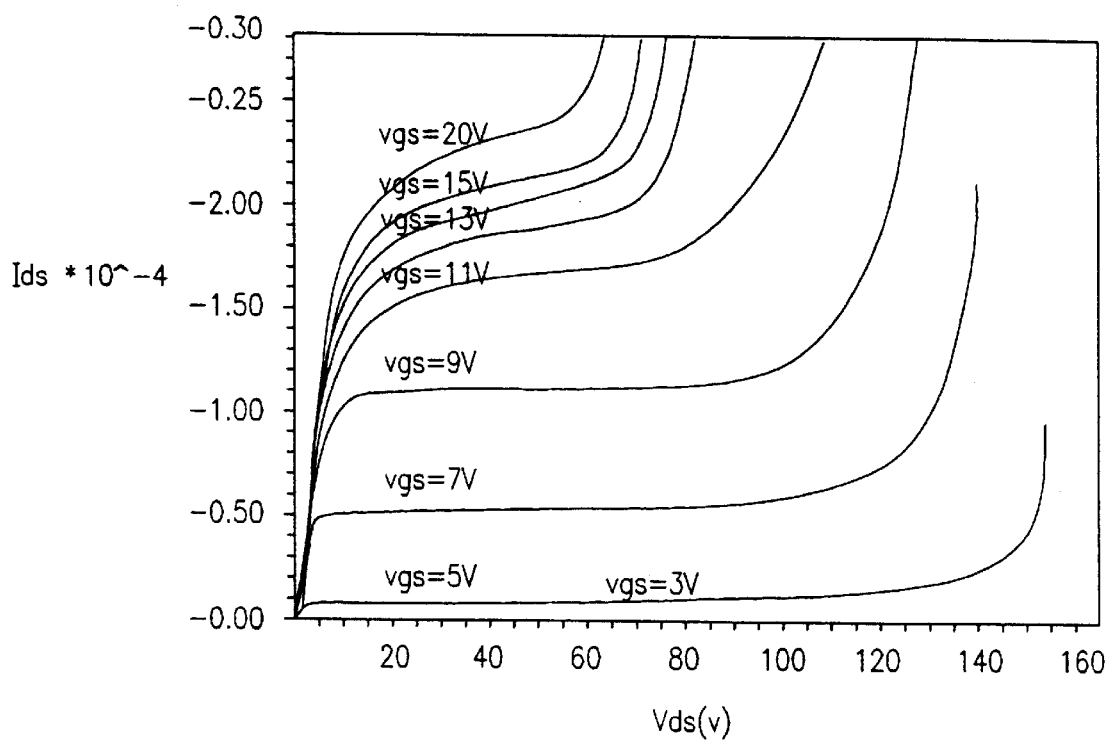
Figure 8A:
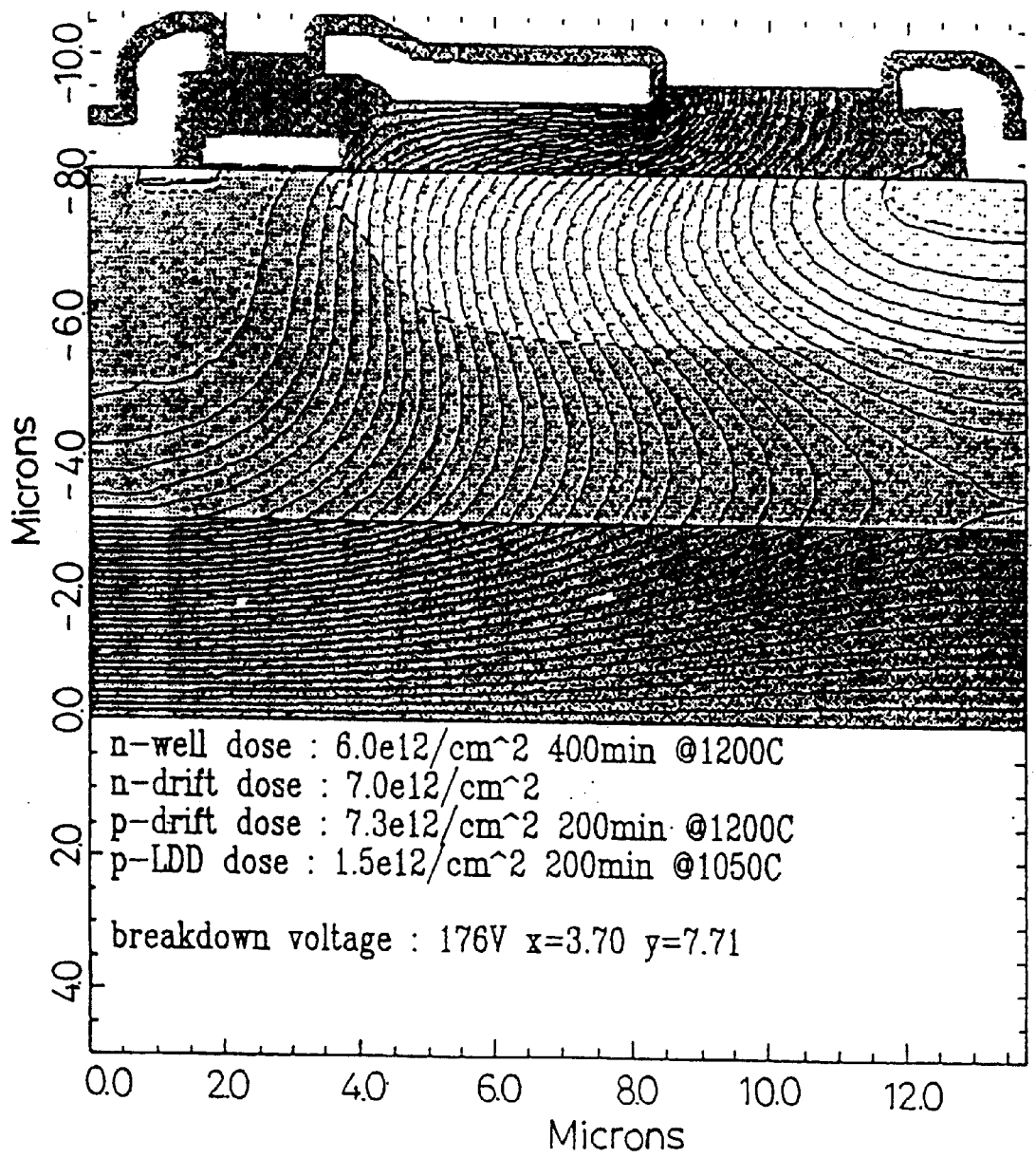
FIGS. 8A to 8B are graphs plotting simulated breakdown voltages of a p-type EDMOSFET according to the present invention.
Figure 8B:
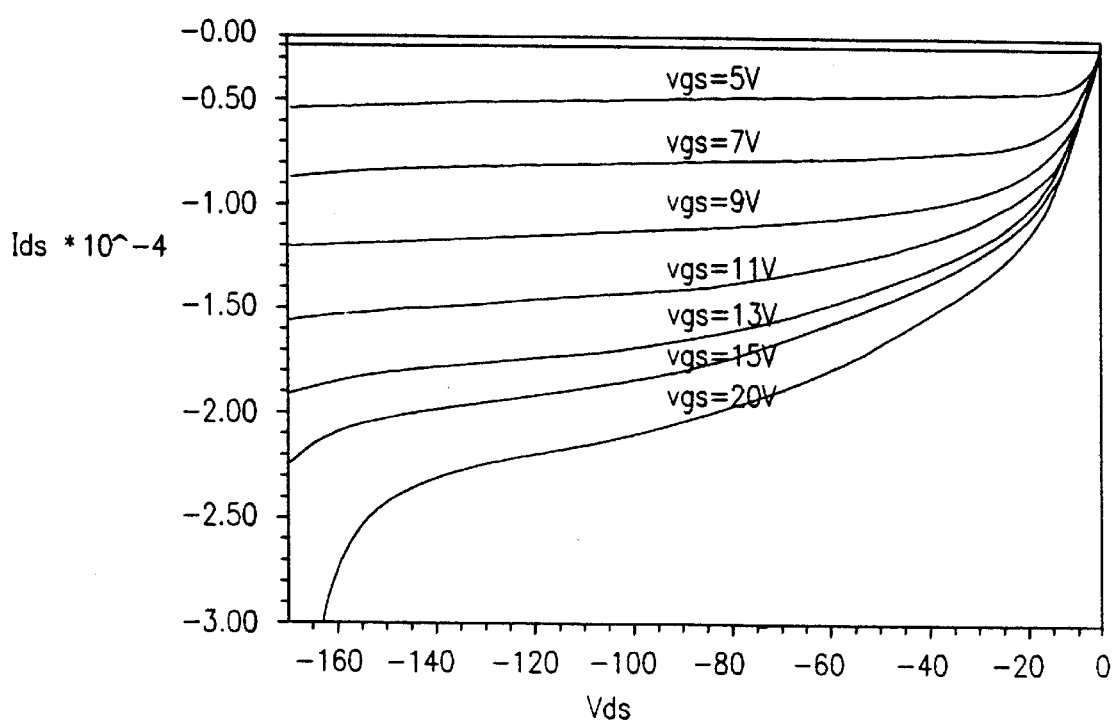
Figure 9A:
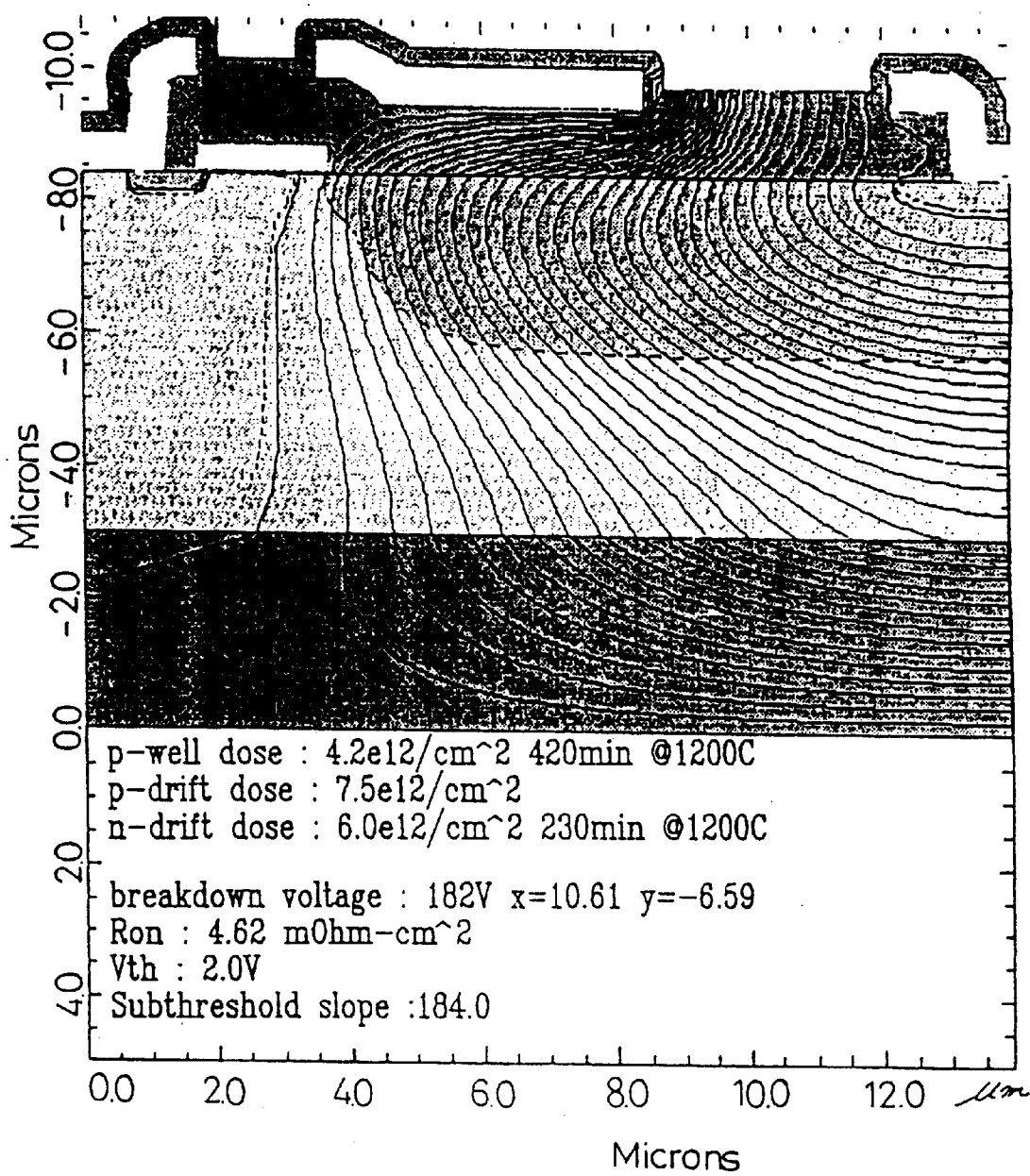
FIGS. 9A to 9B are graphs plotting simulated breakdown voltages of an n-type EDMOSFET according to the present invention.
Figure 9B:
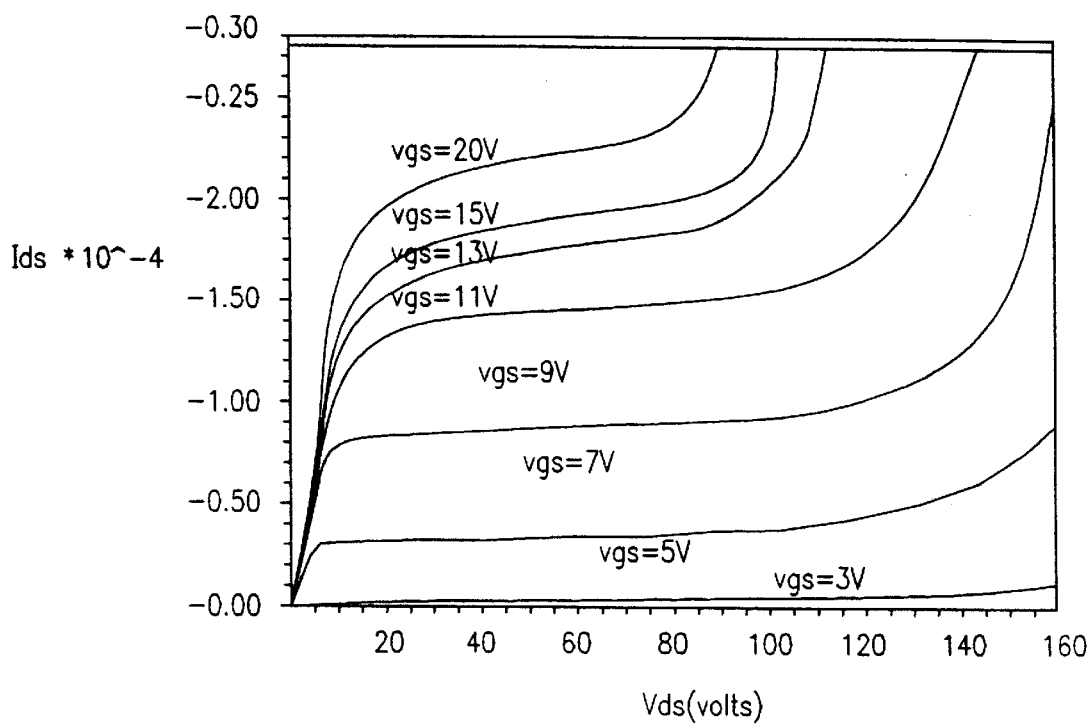

A comparison of FIGS. 6B and 8B shows that a secondary breakdown voltage of the present invention p-type EDMOSFET is higher than that of the conventional p-type EDMOSFET. More specifically, when the voltage difference between gate and source is −20 V, a breakdown voltage is about −90 V for the background art p-type EDMOSFET, whereas it is about −150 V for the present invention having a buffer layer surrounding the drain region.

Similarly, in comparing FIGS. 7 and FIG. 9, the secondary breakdown voltage of the present invention n-type EDMOSFET is also higher than that of the conventional n-type EDMOSFET. For example, when the voltage difference between gate and source is −20 V, the breakdown voltage of the background art n-type EDMOSFET is around 60 V, while that of the present invention having a buffer layer surrounding the drain region is about 90 V.

What is claimed is:

1. A method of fabricating a high voltage field effect transistor having a semiconductor substrate, comprising the steps of:

forming a first conductivity type well in the semiconductor substrate;

forming first and second conductivity type drift regions in the first conductivity type well;

forming a gate electrode over the first conductivity type drift region;

forming a lightly doped second conductivity type buffer layer in the second conductivity type drift region and a lightly doped second conductivity type layer at a boundary between the first and second conductivity type drift regions;

forming a heavily doped first conductivity type impurity region in the first conductivity type drift region and a heavily doped second conductivity type impurity region in the buffer layer; and forming a heavily doped second conductivity type impurity region in the first conductivity type drift region.

2. The method according to claim 1, further comprising the steps of:

forming source and drain electrodes on the heavily doped first conductivity type impurity region in the first conductivity type drift region and the heavily doped second conductivity type impurity region in the buffer layer; and forming a field plate over the gate electrode and the second conductivity type drift region.

3. The method according in claim 1, wherein the first conductivity type is a p-type and the second conductivity type is an n-type.

4. The method according to claim 1, wherein the first conductivity type is an n-type and the second conductivity type is p-type.

5. The method according to claim 1, wherein the second conductivity type buffer layer has a concentration lower than the heavily doped first conductivity type impurity regions in the first conductivity type drift region and the heavily doped second conductivity type impurity region in the buffer layer regions.

6. The method according to claim 1, wherein the buffer layer has a concentration the same as the first conductivity type well between the gate electrode and the second conductivity type drift region.

7. The transistor according to claim 1, wherein the step of forming of a first conductivity type well is executed by an ion implantation and a diffusion.

8. The transistor according to claim 7, wherein the ion implantation is executed by doping boron ions having a concentration of $5.3 \times 10^{12}$ atoms/cm$^2$ at an energy of 50 KeV.

9. The transistor according to claim 7, wherein the diffusion is carried out at 1200° C. for about 380 minutes.

10. The transistor according to claim 1, wherein the step of forming a lightly doped second conductivity type buffer layer in the second conductivity type drift region is executed by implanting n-type impurities having a concentration of $1 \times 10^{12}$ atoms/cm$^2$ at an energy of 80 KeV.

* * * * *